(12) United States Patent
Weman et al.

(10) Patent No.: US 10,243,104 B2
(45) Date of Patent: Mar. 26, 2019

(54) NANOWIRE DEVICE HAVING GRAPHENE TOP AND BOTTOM ELECTRODES AND METHOD OF MAKING SUCH A DEVICE

(71) Applicant: NORWEGIAN UNIVERSITY OF SCIENCE AND TECHNOLOGY (NTNU), Trondheim (NO)

(72) Inventors: Helge Weman, Ecublens (CH); Bjørn-Ove Fimland, Trondheim (NO); Dong Chul Kim, Trondheim (NO)

(73) Assignee: NORWEGIAN UNIVERESITY OF SCIENCE AND TECHNOLOGY (NTNU), Trondheim (NO)

( * ) Notice: Subject to any disclaimer, the term of this patent is extended or adjusted under 35 U.S.C. 154(b) by 0 days.

(21) Appl. No.: 14/371,621

(22) PCT Filed: Jan. 10, 2013

(86) PCT No.: PCT/EP2013/050419
§ 371 (c)(1),
(2) Date: Feb. 11, 2015

(87) PCT Pub. No.: WO2013/104723
PCT Pub. Date: Jul. 18, 2013

(65) Prior Publication Data
US 2015/0076450 A1    Mar. 19, 2015

(30) Foreign Application Priority Data

Jan. 10, 2012  (GB) .................................. 12003355.4

(51) Int. Cl.
*H01L 33/24*    (2010.01)
*H01L 21/02*    (2006.01)
(Continued)

(52) U.S. Cl.
CPC .............. *H01L 33/24* (2013.01); *B82Y 10/00* (2013.01); *B82Y 40/00* (2013.01); *C30B 25/005* (2013.01);
(Continued)

(58) Field of Classification Search
CPC ............... H01L 33/24; H01L 21/02603; H01L 21/02639; H01L 21/02444;
(Continued)

(56) References Cited

U.S. PATENT DOCUMENTS 7,442,575 B2    10/2008    Coffer
7,594,982 B1    9/2009    Roscheisen et al.
(Continued)

FOREIGN PATENT DOCUMENTS

CN    102376817    3/2012
EP    1829141    9/2007
(Continued)

OTHER PUBLICATIONS

Park et al, Inorganic nanostructures grown on graphene layers, Jul. 25, 2011, Nanoscale, 2011, 3, 3522-3533.*
(Continued)

*Primary Examiner* — Joseph C. Nicely
(74) *Attorney, Agent, or Firm* — Meunier Carlin & Curfman LLC

(57) ABSTRACT

A composition of matter comprising a plurality of nanowires on a substrate, said nanowires having been grown epitaxially on said substrate in the presence of a metal catalyst such that a catalyst deposit is located at the top of at least some of said nanowires, wherein said nanowires comprise at least one group III-V compound or at least one group II-VI compound or comprises at least one non carbon group IV element; and wherein a graphitic layer is in contact with at least some of the catalyst deposits on top of said nanowires.

22 Claims, 7 Drawing Sheets

(51) Int. Cl.
| | |
|---|---|
| *H01L 21/203* | (2006.01) |
| *H01L 21/205* | (2006.01) |
| *H01L 21/20* | (2006.01) |
| *H01L 21/208* | (2006.01) |
| *H01L 29/06* | (2006.01) |
| *B82Y 10/00* | (2011.01) |
| *B82Y 40/00* | (2011.01) |
| *H01L 29/66* | (2006.01) |
| *H01L 29/16* | (2006.01) |
| *H01L 29/41* | (2006.01) |
| *C30B 25/00* | (2006.01) |
| *C30B 29/42* | (2006.01) |
| *H01L 31/0224* | (2006.01) |
| *H01L 31/0304* | (2006.01) |
| *H01L 31/0352* | (2006.01) |
| *H01L 31/036* | (2006.01) |
| *H01L 31/18* | (2006.01) |
| *H01L 33/00* | (2010.01) |
| *H01L 33/18* | (2010.01) |
| *H01L 33/30* | (2010.01) |
| *H01L 33/42* | (2010.01) |

(52) U.S. Cl.
CPC ........ *C30B 29/42* (2013.01); *H01L 21/02376* (2013.01); *H01L 21/02444* (2013.01); *H01L 21/02521* (2013.01); *H01L 21/02603* (2013.01); *H01L 21/02639* (2013.01); *H01L 21/20* (2013.01); *H01L 21/2036* (2013.01); *H01L 21/2056* (2013.01); *H01L 21/2085* (2013.01); *H01L 29/0665* (2013.01); *H01L 29/0676* (2013.01); *H01L 29/1606* (2013.01); *H01L 29/413* (2013.01); *H01L 29/66469* (2013.01); *H01L 31/022466* (2013.01); *H01L 31/0304* (2013.01); *H01L 31/036* (2013.01); *H01L 31/035281* (2013.01); *H01L 31/1852* (2013.01); *H01L 31/1884* (2013.01); *H01L 33/0066* (2013.01); *H01L 33/18* (2013.01); *H01L 33/30* (2013.01); *H01L 33/42* (2013.01); *H01L 2933/0016* (2013.01)

(58) Field of Classification Search
CPC ......... H01L 21/02376; H01L 21/02521; H01L 21/20; H01L 21/2036; H01L 21/2056; H01L 21/2085; H01L 29/0665; H01L 29/1606; H01L 33/30; H01L 29/66469
See application file for complete search history.

(56) References Cited

U.S. PATENT DOCUMENTS

| | | | |
|---|---|---|---|
| 7,608,147 B2 | 10/2009 | Samuelson et al. | |
| 7,911,035 B2* | 3/2011 | Seifert | B01J 23/52 257/615 |
| 7,965,960 B2 | 6/2011 | Kim et al. | |
| 8,440,350 B1* | 5/2013 | Verbrugge | H01M 4/0421 429/209 |
| 8,417,153 B2 | 8/2013 | Kim et al. | |
| 2002/0175408 A1 | 11/2002 | Majumdar et al. | |
| 2003/0044608 A1 | 3/2003 | Yoshizawa et al. | |
| 2006/0125056 A1 | 6/2006 | Samuelson et al. | |
| 2006/0188774 A1* | 8/2006 | Niu | H01M 4/8846 429/409 |
| 2007/0177139 A1* | 8/2007 | Kamins | G02B 6/107 356/301 |
| 2007/0212538 A1 | 9/2007 | Niu | |
| 2008/0081439 A1* | 4/2008 | Coffer | B82Y 10/00 438/468 |
| 2008/0142066 A1* | 6/2008 | Plissonnier | H01L 35/32 136/200 |
| 2008/0142926 A1* | 6/2008 | Seifert | B01J 23/52 257/615 |
| 2008/0191317 A1* | 8/2008 | Cohen | B82Y 10/00 257/618 |
| 2009/0057649 A1* | 3/2009 | Sutter | B81C 1/00206 257/15 |
| 2009/0176159 A1 | 7/2009 | Zhamu et al. | |
| 2009/0235862 A1 | 9/2009 | Cha et al. | |
| 2009/0293946 A1* | 12/2009 | Lin | H01L 51/0003 136/255 |
| 2010/0035412 A1* | 2/2010 | Samuelson | B82Y 10/00 438/478 |
| 2010/0155702 A1* | 6/2010 | Wernersson | B82Y 10/00 257/24 |
| 2010/0171096 A1* | 7/2010 | Sutter | B82Y 10/00 257/14 |
| 2010/0252808 A1* | 10/2010 | Samuelson | B81C 1/00111 257/13 |
| 2010/0314617 A1* | 12/2010 | Ito | B81C 1/00111 257/43 |
| 2010/0327258 A1* | 12/2010 | Lee | H01L 21/0237 257/14 |
| 2011/0030991 A1* | 2/2011 | Veerasamy | C30B 29/02 174/126.1 |
| 2011/0121264 A1* | 5/2011 | Choi | B82Y 10/00 257/14 |
| 2011/0129675 A1* | 6/2011 | Choi | H01L 31/035227 428/408 |
| 2011/0133061 A1* | 6/2011 | Yu | B82Y 15/00 250/214.1 |
| 2011/0163292 A1 | 7/2011 | Wang et al. | |
| 2011/0168256 A1* | 7/2011 | Wang | H01L 31/035227 136/258 |
| 2011/0175059 A1* | 7/2011 | Kahen | B82Y 10/00 257/14 |
| 2011/0177683 A1* | 7/2011 | Kahen | B82Y 10/00 438/509 |
| 2011/0220171 A1* | 9/2011 | Mathai | H01L 31/022425 136/244 |
| 2011/0220864 A1* | 9/2011 | Kim | C22C 19/07 257/10 |
| 2011/0240099 A1* | 10/2011 | Ellinger | H01L 31/0296 136/250 |
| 2011/0260325 A1 | 10/2011 | Koto | |
| 2011/0291068 A1 | 12/2011 | Kobayashi | |
| 2011/0313194 A1* | 12/2011 | Lee | B82Y 30/00 564/8 |
| 2012/0021554 A1* | 1/2012 | Neel | C30B 11/12 438/65 |
| 2012/0041246 A1* | 2/2012 | Scher | B01J 21/066 585/500 |
| 2012/0068122 A1* | 3/2012 | Kranbuehl | B82Y 30/00 252/503 |
| 2012/0068157 A1* | 3/2012 | Kub | B82Y 10/00 257/15 |
| 2012/0090057 A1* | 4/2012 | Cohen | B82Y 15/00 850/40 |
| 2012/0132930 A1 | 5/2012 | Young et al. | |
| 2012/0135158 A1* | 5/2012 | Freer | B82Y 10/00 427/532 |
| 2012/0141799 A1 | 6/2012 | Kub et al. | |
| 2012/0145549 A1* | 6/2012 | Cho | G01N 33/48721 204/603 |
| 2012/0192931 A1* | 8/2012 | Jeon | B82Y 30/00 136/252 |
| 2012/0241192 A1* | 9/2012 | Cai | B82Y 30/00 174/126.2 |
| 2012/0270054 A1* | 10/2012 | Hong | B29B 15/08 428/408 |
| 2013/0158322 A1* | 6/2013 | Nyce | B01J 23/30 585/330 |
| 2013/0213470 A1 | 8/2013 | Yi et al. | |
| 2013/0221322 A1* | 8/2013 | Ohlsson | B82Y 10/00 257/13 |

(56) References Cited

U.S. PATENT DOCUMENTS

| | | | | |
|---|---|---|---|---|
| 2013/0280894 A1* | 10/2013 | Lee | ............. | H01L 21/027 438/479 |
| 2013/0334497 A1* | 12/2013 | Weman | ............. | B82Y 40/00 257/26 |
| 2014/0151826 A1* | 6/2014 | Kelber | ............. | H01L 43/08 257/421 |
| 2014/0161730 A1* | 6/2014 | Sitharaman | ......... | C01B 31/0446 424/9.32 |
| 2014/0182668 A1* | 7/2014 | Pacifici | ............. | H01L 31/035218 136/255 |
| 2014/0252316 A1* | 9/2014 | Yan | ............. | C09K 11/02 257/24 |
| 2014/0293164 A1* | 10/2014 | Kim | ............. | G06F 3/041 349/12 |
| 2015/0194549 A1* | 7/2015 | Weman | ............. | H01L 31/022466 136/244 |
| 2015/0311363 A1* | 10/2015 | Park | ............. | C08G 61/126 136/263 |
| 2016/0005751 A1* | 1/2016 | Tsui | ............. | H01L 27/11524 257/315 |

FOREIGN PATENT DOCUMENTS

| | | |
|---|---|---|
| EP | 1952467 | 8/2008 |
| KR | 2009/0003840 | 4/2009 |
| KR | 20120092431 | 8/2012 |
| WO | 2006/062947 | 6/2006 |
| WO | 2007/061945 | 5/2007 |
| WO | 2010/056061 | 5/2010 |
| WO | 2010/096035 | 8/2010 |
| WO | 2011/016837 | 2/2011 |
| WO | 2011016837 | 2/2011 |
| WO | 2011/081440 | 7/2011 |
| WO | 2011090863 | 7/2011 |
| WO | 2012080252 | 6/2012 |

OTHER PUBLICATIONS

Office Action from USPTO issued in U.S. Appl. No. 13/993,740, dated Oct. 22, 2014.

Mariani et al., Patterned Radial GaAs Nanopillar Solar Cells. Nano Letters 2011, 11, 2490-2494.

Mohseni et al., Hybrid GaAs-Nanowire-Carbon-Nanotube Flexible Photovoltaics. IEEE Journal of Selected Topics in Quantum Electronics 2011, 17(4), 1070-1077.

Nistor et al., The Role of Chemistry in Graphene Doping for Carbon-Based Electronics. ACS Nano 2011, 5(4), 3096-3103.

Park et al., Inorganic Nanostructures Grown on Graphene Layers. Nanoscale 2011, 3(9), 3522-3533.

Sun et al., Compound Semiconductor Nanowire Solar Cells. IEEE Journal of Selected Topics in Quantum Electronics 2011, 17(4), 1033-1049.

Chung, et al., "Transferrable GaN Layers Grown on ZnO-Coated Graphene layers for Optoelectronic Devices," *Science*, 2010, vol. 330, pp. 655-657.

Dheeraj, et al., "Controlling crystal phases in GaAs nanowires grown by Au-assisted molecular beam epitaxy," Norwegian University of Science and Technology, NO-7491, Trondheim, Norway, Fifth "Nanowire Growth Workshop" Nov. 4-5, Rome, Italy, 2010, 2 pages.

Kim, et al., "Vertically aligned ZnO nanostructures grown on grapheme layers," *Applied Physics Letters*, vol. 95, 2009, pp. 213101-1 through 213101-3.

Paek, et al., "MBE-VLS growth of GaAs nanowires on (111)Si substrate," *Physica Status Solidi* (C), vol. 5, No. 9, 2008, pp. 2740-2742.

Patsha, et al., "Growth of GaN nanostructures on graphene," *Nanoscience*, 2011 International Conference on Engineering and Technology, Nov. 28, 2011, pp. 553-555.

Peng, et al., "Control of growth orientation of GaN nanowires," *Chemical Physics Letters*, vol. 359, 2002, pp. 241-245.

Plissard, et al., Gold-free growth of GaAs nanowires on silicon: arrays and polytypism, *Nanotechnology*, vol. 21, 2010, pp. 1-8.

Wang, et al., "Growth of nanowires," Materials Science and Engineering, vol. 60, Nos. 1-6, 2008, pp. 1-51.

Wang, et al., "Nanocrystal Growth on Graphene with Various Degrees of Oxidation," *J. Am. Chem. Soc.*, vol. 132, 2010, pp. 3270-3271.

Yoon, et al., "Vertical Epitaxial $Co_5Ge_7$ Nanowire and Nanobelt Arrays on a Thin Graphic Layer for Flexible Field Emission Displays," *Advanced Materials*, vol. 21, 2009, pp. 4979-4982.

International Preliminary Report on Patentability and Written Opinion, dated Jul. 15, 2014, in connection with corresponding International Application No. PCT/EP2013/050419.

International Search Report, dated Apr. 8, 2013, in connection with corresponding International Application No. PCT/EP2013/050419.

International Preliminary Report on Patentability and Written Opinion, dated Jun. 18, 2013, in connection with related International Application No. PCT/EP2011/072612.

International Search Report, dated May 2, 2012, in connection with related International Application No. PCT/EP2011/072612.

Yu et al. "Electronic properties of nitrogen-atom-adsorbed graphene nanoribbons with armchair edges." Transaction of Nanotechnology, 2010, 9(2), 243-247.

Office Action issued in U.S. Appl. No. 13/993,740, dated Feb. 2, 2017.

Office Action issued in U.S. Appl. No. 14/409,837, dated Mar. 22, 2017.

Office Action issued in U.S. Appl. No. 13/993,740, dated Aug. 29, 2016.

Office Action issued in U.S. Appl. No. 14/409,837, dated Jul. 14, 2016.

Marzouki, et al., "Structural and optical characterizations of nitrogen-doped ZNO nanowires grown by MOCVD", Materials Letters 64, 2010, 2112-2114.

Office Action dated Aug. 28, 2017 in related U.S. Appl. No. 14/409,837.

Non-final Office Action, dated Dec. 9, 2015, received in connection with U.S. Appl. No. 13/993,740.

* cited by examiner

NANOWIRE DEVICE HAVING GRAPHENE TOP AND BOTTOM ELECTRODES AND METHOD OF MAKING SUCH A DEVICE

This invention concerns the use of thin graphitic layers as a transparent, conductive and flexible top contact electrode material for nanowire arrays preferably grown by a metal catalyst vapour-liquid-solid (VLS) method. In particular, the metal catalytic particles that remain on top of the nanowires after the nanowire growth are beneficially used as an intermediate material to enhance the electrical contact of nanowires to the top-contacted graphitic layers. The resulting array of nanowires, preferably composed of semiconductor materials, with a top-contact to the transparent, flexible graphitic layers have a wide range of applications in opto-electronic device applications including nanowire light-emitting diodes (LEDs) and nanowire solar cells.

Over recent years, the interest in semiconductor nanowires has intensified as nanotechnology becomes an important engineering discipline. Nanowires, which are also referred to as nanowhiskers, nanorods, nanopillars or nanocolumns etc by some authors, have found important applications in a variety of electrical devices such as sensors, solar cells to LED's.

For the purpose of this application, the term nanowire is to be interpreted as a structure being essentially in one-dimensional form, i.e. is of nanometer dimensions in its width or diameter and its length typically in the range of a few 100 nm to a few μm. Usually, nanowires are considered to have at least two dimensions not greater than 500 nm, such as not greater than 350 nm, especially not greater than 300 nm such as not greater than 200 nm.

Many different types of nanowires exist, including metallic (e.g., Ni, Pt, Au), semiconducting (e.g., Si, InP, GaN, GaAs, ZnO), and insulating (e.g., $SiO_2$, $TiO_2$) nanowires. The present inventors are primarily concerned with semiconductor nanowires although it is envisaged that the principles outlined in detail below are applicable to all manner of nanowire technology.

Conventionally, semi-conductor nanowires have been grown on a substrate identical to the nanowire itself (homoepitaxial growth). Thus GaAs nanowires are grown on GaAs substrates and so on. This, of course, ensures that there is a lattice match between the crystal structure of the substrate and the crystal structure of the growing nanowire. Both substrate and nanowire can have identical crystal structures.

Growing a nanowire on a matching substrate is, however, expensive and limiting. For example, GaAs substrates need to be specifically manufactured and that is expensive. In order to ensure nanowire growth in the normally favoured [111]B direction, the substrate needs to be specially sliced to have (111)B oriented surface, as compared to the more normal substrate with (001) oriented surface. (111)B oriented GaAs substrates are more expensive than (001) oriented GaAs substrates. Also, GaAs is not the ideal material to carry a nanowire anyway. It is not mechanically strong or inert for example. It is not flexible or transparent. It would be better if other more attractive substrates could be employed.

The present inventors sought ways of using more substrates. Of course, doing so is not just a matter of using a different substrate. As soon as the substrate is different from the nanowire being grown then there is, by definition, a potential lattice mismatch between substrate and nanowire as well as numerous other possible problems to consider.

In one embodiment of the invention, the present inventors grow nanowires epitaxially on graphitic substrates. Graphitic substrates are substrates composed of single or multiple layers of graphene or its derivatives. In its finest form, graphene is a one atomic layer thick sheet of carbon atoms bound together with double electron bonds (called a $sp^2$ bond) arranged in a honeycomb lattice pattern. Unlike other semiconductor substrates, graphitic substrates are thin, light, and flexible, yet very strong.

They can be easily transferred onto any other substrates. Compared to other existing transparent conductors such as ITO, ZnO/Ag/ZnO, $TiO_2$/Ag/$TiO_2$, graphene has been proven to have superior opto-electrical properties as shown in a recent review article in Nature Photonics 4 (2010), 611.

For many applications it will be important that the nanowires can be grown vertically, perpendicular to the substrate surface. Semiconductor nanowires normally grow in the [111] direction (if cubic crystal structure) or the [0001] direction (if hexagonal crystal structure). This means that the substrate surface needs to be (111) or (0001) oriented where the surface atoms of the substrate is arranged in a hexagonal symmetry.

The present inventors have found that epitaxial nanowires of certain compounds/elements can be grown on graphitic substrates. Since graphitic substrates have no dangling bonds at the surface and very short atomic bond length compared with typical semiconductors like silicon and GaAs, there is no reason to anticipate nucleation and epitaxial growth of nanowires thereon. As surprisingly noted below, there is a good lattice match with many semiconductors when using graphene depending on how the semiconductor atoms are placed on the surface of graphene.

In particular, the use of molecular beam epitaxy offers excellent results in terms of nanowire growth. In particular the invention enables the growth of group IV, II-VI or in particular group III-V semiconductor nanowires on graphitic substrates.

Even if nanowires can be grown on a substrate, there remains the problem of using those nanowires successfully in a device. If a nanowire is purely composed of semiconductors, it would naturally form a Schottky contact to metals depending on the work function of the contacted metal. So it is expected that the metallic graphitic layers contacted to semiconductors will also form a Schottky junction as demonstrated by S. Tongay et al. in Appl. Phys. Lett. 95 (2009), 222103. The formation of a non-ohmic, Schottky junction between graphitic layers and semiconductors is detrimental to the efficiency of devices such as LEDs and solar cells by blocking the proper current flow though contacts.

The present inventors sought a way of generating an ohmic top contact using graphitic layers as the material for the top-contact to semiconductor nanowire arrays vertically grown on substrates. In this way the advantageous properties of graphitic layers (as top contacts) in terms of flexibility and transparency can be combined with valuable electrical properties.

The present inventors have realised that the growth of semiconductor nanowires can involve metal catalyst particles. In particular, for the growth of nanowires using the molecular beam epitaxy (MBE) or metal organic vapour phase epitaxy (MOVPE) techniques, metal catalysts such as Au, Ga, or In are preferably used as seeds for the growth of nanowires. The metal catalyst has the form of a nanoparticle that remains on top of each nanowire after completion of the nanowire growth. The present inventors have realised that metal catalysts deposited on the top of a growing nanowire can be used to make self-aligned ohmic contacts between grown nanowire arrays and graphitic layers as a top contact material.

It is worth noting that the mentioned top contact between graphitic layers and grown nanowires could be fundamentally different from the bottom contact between as-grown nanowires and substrates such as Si(111), GaAs (111), and especially graphitic substrates. Because nanowires are epitaxially grown involving physical and chemical bonding to substrates at high temperature, the bottom contact is expected to be much better and intimate, preferably ohmic.

There is limited discussion of this type of idea in the literature. Soo-Ghang Ihn et al., IEEE Transactions on Nanotechnology 6 (2007), 384, report an observation of ohmic I-V curves in nanowires grown by Au-assisted MBE by contacting to the Au catalytic particle on top of single nanowire using an atomic force microscope tip.

Jung Min Lee et al., Nano Lett. 10 (2010), 2783 reports on the fabrication of vertical pillar-superlattice arrays and graphene hybrid LEDs. In this paper vertical arrays of GaAs nanopillars were made by "top-down" etching and graphene was used as a transparent top contact material. To evade from the expected Schottky contact between the top of semiconducting nanopillars and graphene, thin metal layers of Ti/Au (~4 nm) were deposited onto the graphene. The metal-deposited side of graphene was used as the top contact to the nanopillars with a subsequent post-annealing. Due to the deposition of thin metal layers, the graphene top-contact suffers from a significant reduction of the transmittance from ~98% for bare graphene to ~70% for the metal/graphene contact.

In contrast to this, nanowires grown by a metal catalyst-assisted vapour-liquid-solid (VLS) "bottom-up" method naturally have a metallic nanoparticle left at the top. These metal nanoparticles can be used to facilitate the formation of self-aligned ohmic contacts to the graphitic layers with a possible post-annealing processes or doping of the graphitic layers. An added benefit of using such metallic particles as self-aligned contacts is that since the metallic particles are only positioned at the nanowire/graphitic layer contact points, it would not affect the overall optical transparency of the top-contacted graphitic layers. The superior properties of the graphitic layers as a top contact material can be fully utilized in resulting opto-electronic devices.

SUMMARY OF INVENTION

Thus, viewed from one aspect the invention provides a composition of matter comprising a plurality of nanowires on a substrate, said nanowires having been grown epitaxially on said substrate in the presence of a metal catalyst, preferably in a vapour-liquid-solid method, such that a catalyst deposit is located at the top of at least some of said nanowires, wherein said nanowires comprise at least one group III-V compound or at least one group II-VI compound or comprises at least one non carbon group IV element; and wherein a graphitic layer is in contact with at least some of the catalyst deposits on top of said nanowires.

Viewed from another aspect the invention provides a process comprising:

(I) providing group II-VI elements or group III-V elements or at least one non carbon group IV element to the surface of a substrate, preferably via a molecular beam;

(II) epitaxially growing a plurality of nanowires from the surface of the substrate in the presence of a metal catalyst such that a catalyst deposit remains on the top of at least some of said nanowires;

(III) contacting said metal catalyst deposits with a graphitic layer a graphitic layer is in contact with at least some of the catalyst deposits on top of said nanowires.

Optionally, the surface of the substrate can be chemically/physically modified to enhance the epitaxial growth of nanowires.

Viewed from another aspect the invention provides a device, such as an electronic device, comprising a composition as hereinbefore defined, e.g. a solar cell.

Definitions

By a group III-V compound is meant one comprising at least one ion from group III and at least one ion from group V. Similarly, a group II-VI compound is one comprising at least one group II ion and at least one group VI ion. In this application the term group (II) covers both classic group (IIa) and (IIb) periods, i.e. the alkaline earth series and the Zn series of elements. Group IV elements include Si and Ge. It will be appreciated that the term group IV element covers both a single group IV element and also the presence of two such elements which may combine to form a compound such as SiC or SiGe. There may be more than one ion present from each group, e.g. InGaAs and so on. Non carbon group IV nanowires are those that contain at least one non carbon group IV element only, for example a Si nanowire or SiC nanowire.

The term semiconducting nanowire is meant nanowire made of semiconducting materials from group II-VI elements or group III-V elements or group IV element.

The term nanowire is used herein to describe a solid, wire like structure of nanometer dimensions. Nanowires preferably have an even diameter throughout the majority of the nanowire, e.g. at least 75% of its length. The term nanowire is intended to cover the use of nanorods, nanopillars, nanocolumns or nanowhiskers some of which may have tapered end structures. The nanowires can be said to be in essentially in one-dimensional form with nanometer dimensions in their width or diameter and their length typically in the range of a few 100 nm to a few μm. Ideally the nanowire diameter is not greater than 500 nm. Typically, the nanowire will have two dimensions not greater than 500 nm, such as not greater than 350 nm, especially not greater than 300 nm, such as not greater than 200 nm.

Ideally, the diameter at the base of the nanowire and at the top of the nanowire should remain about the same (e.g. within 20% of each other). It will be appreciated that the wire has to narrow at the very top, typically forming a hemisphere.

It will be appreciated that the substrate comprises a plurality of nanowires. This may be called an array of nanowires.

Graphitic layers for substrates or top contacts are films composed of single or multiple layers of graphene or its derivatives. The term graphene refers to a planar sheet of $sp^2$-bonded carbon atoms in a honeycomb crystal structure. Derivatives of graphene are those with surface modification. For example, the hydrogen atoms can be attached to the graphene surface to form graphane. Graphene with oxygen atoms attached to the surface along with carbon and hydrogen atoms is called as graphene oxide. The surface modification can be also possible by chemical doping or oxygen/hydrogen plasma treatment.

The term epitaxy comes from the Greek roots epi, meaning "above", and taxis, meaning "in ordered manner". The atomic arrangement of the nanowire is based on the crystallographic structure of the substrate. It is a term well used in this art. Epitaxial growth means herein the growth on the substrate of a nanowire that mimics the orientation of the substrate.

Metal catalyst-assisted vapour-liquid-solid (VLS) method is a method to grow nanowires from metal catalysts which act as nucleation sites for the growth of nanowires. The metal catalysts are provided by depositing a thin layer of catalytic material over the substrate surface, which would be melted into nano-sized particles by increasing the temperature for the nanowire growth.

The term catalyst deposit refers to the catalyst material that remains on top of the growing nanowire. It can be considered a nanoparticle of catalyst.

Molecular beam epitaxy (MBE) is a method of forming depositions on crystalline substrates. The MBE process is performed by heating a crystalline substrate in a vacuum so as to energize the substrate's lattice structure. Then, an atomic or molecular mass beam(s) is directed onto the substrate's surface. The term element used above is intended to cover application of atoms, molecules or ions of that element. When the directed atoms or molecules arrive at the substrate's surface, the directed atoms or molecules encounter the substrate's energized lattice structure or a catalyst droplet as described in detail below. Over time, the oncoming atoms form a nanowire.

DETAILED DESCRIPTION OF INVENTION

This invention concerns the use of graphitic layers as a top contact electrode material to semiconductor nanowire arrays epitaxially grown in the presence of a metal catalyst, ideally via a metal catalyst-assisted vapour-liquid-solid (VLS) method. Ideally, the graphitic layer is transparent, conductive and flexible. The semiconductor nanowire array comprises a plurality of nanowires grown epitaxially on a substrate.

Having a nanowire grown epitaxially provides homogeneity to the formed material which may enhance various end properties, e.g. mechanical, optical or electrical properties.

Epitaxial nanowires may be grown from gaseous or liquid precursors. Because the substrate acts as a seed crystal, the deposited nanowire can take on a lattice structure and orientation identical to those of the substrate. This is different from other thin-film deposition methods which deposit polycrystalline or amorphous films, even on single-crystal substrates.

Substrate for Nanowire Growth

The substrate used to grow nanowires of the invention can be any convenient substrate such as semiconductor substrates. Semiconductor substrates used for epitaxial and vertical growth of nanowires may have the same type of crystal structure and crystal orientation as the base of the nanowire, as well as a close lattice match. They can be silicon or GaAs substrates such as with (111) oriented surface where the nanowires can be grown perpendicular to the substrates in the [111] (for cubic crystal structure) or [0001] (for hexagonal crystal structure) direction. GaAs (111) and Si (111) are especially preferred substrates.

Semiconductor substrates of interest are therefore based on group II-VI elements or group III-V elements or at least one non carbon group IV element, for example.

The substrate is preferably a graphitic substrate, more especially it is graphene. As used herein, the term graphene refers to a planar sheet of $sp^2$-bonded carbon atoms that are densely packed in a honeycomb (hexagonal) crystal lattice. This graphene substrate should contain no more than 10 layers of graphene or its derivatives, preferably no more than 5 layers (which is called as a few-layered graphene). Especially preferably, it is a one-atom-thick planar sheet of graphene.

The crystalline or "flake" form of graphite consists of many graphene sheets stacked together (i.e. more than 10 sheets). By graphitic substrate therefore, is meant one formed from one or a plurality of graphene sheets.

It is preferred if the substrate in general is 20 nm in thickness or less. Graphene sheets stack to form graphite with an interplanar spacing of 0.335 nm. The graphitic substrate preferred comprises only a few such layers and may ideally be less than 10 nm in thickness. Even more preferably, the graphitic substrate may be 5 nm or less in thickness. The area of the substrate in general is not limited. This might be as much as 0.5 $mm^2$ or more, e.g. up to 5 $mm^2$ or more such as up to 10 $cm^2$. The area of the substrate is thus only limited by practicalities.

The substrate may need to be supported in order to allow growth of the nanowires thereon, especially where that substrate is graphitic. The substrate can be supported on any kind of materials including conventional semiconductor substrates and transparent glasses. The use of silica or SiC is preferred. The support must be inert.

In a highly preferred embodiment, the substrate is a laminated substrate exfoliated from a Kish graphite, a single crystal of graphite or is a highly ordered pyrolytic graphite (HOPG). Alternatively, the substrate could be grown on a Ni film or Cu foil by using a chemical vapour deposition (CVD) method, which can be easily purchased from "Graphene supermarket", USA. The substrate could be a chemical vapour deposition (CVD)-grown graphene substrate on metallic films or foils made of e.g. Cu, Ni, or Pt.

These CVD-grown graphitic layers can be chemically exfoliated from the metal foil such as a Ni or Cu film by etching or by an electrochemical delamination method. The graphitic layers after exfoliation are then transferred and deposited to the supporting substrates for nanowire growth. During the exfoliation and transfer, e-beam resist or photoresist may be used to support the thin graphene layers. These supporting materials can be easily removed by acetone after deposition.

Whilst it is preferred if the graphitic substrate is used without modification, the surface of the graphitic substrate can be modified. For example, it can be treated with plasma of hydrogen, oxygen, $NO_2$ or their combinations. Oxidation of the substrate might enhance nanowire nucleation. It may also be preferable to pretreat the substrate, for example, to ensure purity before nanowire growth. Treatment with a strong acid such as HF or BOE is an option. Substrates might be washed with iso-propanol, acetone, or n-methyl-2-pyrrolidone to eliminate surface impurities.

The cleaned graphitic surface can be further modified by doping. Dopant atoms or molecules may act as a seed for growing nanowires. A solution of $FeCl_3$, $AuCl_3$ or $GaCl_3$ could be used in a doping step.

The graphitic layers, more preferably graphene, are well known for their superior optical, electrical and mechanical properties. They are very thin but very strong, light, flexible, and impermeable. Most importantly in the present invention they are highly electrically and thermally conducting, flexible and transparent. Compared to other transparent conductors such as ITO, ZnO/Ag/ZnO, and $TiO_2/Ag/TiO_2$ which are commercially used now, graphene has been proven to be much more transparent (~98% transmittance in the solar spectral range of interest from 250 to 900 nm in wavelength) and conducting (<1000 Ohm sheet resistance for 1 nm thickness).

Growth of Nanowires

In order to prepare nanowires of commercial importance, it is essential that these grow epitaxially on the substrate. It is also ideal if growth occurs perpendicular to the substrate and ideally therefore in the [111] (for cubic crystal structure) or [0001] (for hexagonal crystal structure) direction. We noted above that this can be achieved using a substrate which is formed from the same material as the growing nanowires by providing the substrate cut in an appropriate fashion.

As noted above, there is no guarantee that this is possible with a particular substrate where that substrate material is different from the nanowire being grown. The present inventors have determined, however, that epitaxial growth on graphitic substrates is possible by determining a possible lattice match between the atoms in the semiconductor nanowire and the carbon atoms in the graphene sheet.

The carbon-carbon bond length in graphene layers is about 0.142 nm. Graphite has hexagonal crystal geometry. This is shown in FIG. 1a. The present inventors have surprisingly realised that graphite can provide a substrate on which semiconductor nanowires can be grown as the lattice mismatch between the growing nanowire material and the graphitic substrate can be very low.

The inventors have realised that due to the hexagonal symmetry of the graphitic substrate and the hexagonal symmetry of the semiconductor atoms in the (111) planes of a nanowire growing in the [111] direction with a cubic crystal structure (or in the (0001) planes of a nanowire growing in the [0001] direction with a hexagonal crystal structure), a lattice match can be achieved between the growing nanowires and the substrate.

FIGS. 1a-1d show four different hexagonal structural configurations of the semiconductor atoms in the (111) (or (0001)) planes of a nanowire on top of the hexagonal lattice of carbon atoms in the graphene layer, placed in such a way that no lattice mismatch will occur. As possible semiconductor adsorption sites on top of graphene, we consider 1) above the center of the hexagonal carbon rings of graphene (H-site) and 2) above the bridge between carbon atoms (B-site), as indicated by arrows in FIG. 1a.

The figures show an idealised lattice-matched arrangement of the semiconductor atoms in the (111) planes of a cubic crystal ((0001) planes for hexagonal) when the atoms are placed on 1) H- and B-sites (FIGS. 1a, 1b and 1d), and 2) H- or B-sites (FIG. 1c). Dashed lines emphasize the hexagonal symmetry of the lattice of semiconductor atoms in the (111) plane. The relative rotations of these hexagons for each atomic arrangement are written on the top of each figure. For (FIG. 1a) and (FIG. 1d) two relative orientations are possible, ±10.9° and ±16.1°, respectively (only the + rotations are shown in the images).

FIG. 1e shows artificial lattice-matched lattice constants for the atomic arrangements in (a), (b), (c) and (d). Dashed and solid lines correspond to the hexagonal ($a_1$) and cubic ($a = a_1 \times \sqrt{2}$) crystal phases of these lattices, respectively. The square (■) and the hexagon represent the cubic and the hexagonal phases, respectively, for Si, ZnO, and group III-V semiconductors. Squares (GaAs, AlAs, AlSb) with two different colours indicate that the semiconductor can adopt either of two atomic arrangements on graphene. The figure visualizes the vast possibilities for epitaxial growth of vertical semiconductor nanowires on graphitic substrates.

If the semiconductor atoms are placed above alternating H- and B-sites as in FIG. 1a, an exact lattice match can be achieved if the lattice constant, a, of a cubic semiconductor crystal (the lattice constant, a, is defined as the side length of the cubic unit cell) is equal to: 4.607 Å. A few cubic semiconductors exist with lattice constants close to this value, with the closest being SiC (a=4.36 Å), AlN (a=4.40 Å) and GaN (a=4.51 Å). For hexagonal semiconductor crystals, exact lattice matches will be achieved if the lattice constant, $a_1$, is equal to: 3.258 Å. A few hexagonal semiconductors exist with lattice constants close to this value, with the closest being SiC ($a_1$=3.07 Å), AlN ($a_1$=3.11 Å), GaN ($a_1$=3.19 Å) and ZnO ($a_1$=3.25 Å) crystals.

If the semiconductor atoms are placed above alternating H- and B-sites as in FIG. 1b, an exact lattice match can be achieved if the lattice constant, a, of a cubic semiconductor crystal is equal to: 1.422 Å (carbon atom distance)×3/2×sqr(6)=5.225 Å. This is close to the lattice constant of Si (a=5.43 Å), GaP (a=5.45 Å), AlP (a=5.45 Å), InN (a=4.98 Å) and ZnS (a=5.42 Å). For hexagonal semiconductor crystals exact lattice matches will be achieved if the lattice constant, $a_1$, is equal to: 1.422 Å×3/2×sqr(3)=3.694 Å. This is close to the $a_1$ lattice constants of the hexagonal forms of InN ($a_1$=3.54 Å) and ZnS ($a_1$=3.82 Å) crystals.

For the atomic configuration as in FIG. 1c an exact lattice match can be achieved if the lattice constant, a, of a cubic semiconductor crystal is equal to: 1.422 Å (carbon atom distance)×3×sqr(2)=6.033 Å. This is close to the lattice constant of group III-V compounds such as InAs, GaAs, InP, GaSb, AlSb and AlAs, and II-VI compounds such as MgSe, ZnTe, CdSe, and ZnSe semiconductor crystals. In particular, this is close to the lattice constant of group III-V compounds such as InAs (a=6.058 Å), GaSb (a=6.096 Å) and AlSb (a=6.136 Å), and II-VI compounds such as ZnTe (a=6.103 Å) and CdSe (a=6.052 Å) semiconductor crystals.

For hexagonal semiconductor crystals, exact lattice matches will be achieved if the lattice constant, $a_1$, is equal to: 1.422 Å (carbon atom distance)×3=4.266 Å. This is close to the $a_1$ lattice constants of the hexagonal forms of the II-VI materials CdS ($a_1$=4.160 Å) and CdSe ($a_1$=4.30 Å) crystals.

If the semiconductor atoms are placed above alternating H- and B-sites as in FIG. 1d, an exact lattice match can be achieved if the lattice constant, a, of a cubic semiconductor crystal is equal to: 6.28 Å. This is close to the lattice constant of InSb (a=6.479 Å), MgTe (a=6.42 Å) and CdTe (a=6.48 Å). For hexagonal semiconductor crystals, exact lattice matches will be achieved if the lattice constant, $a_1$, is equal to: 4.44 Å. This is close to the $a_1$ lattice constants of the hexagonal forms of InSb ($a_1$=4.58 Å), MgTe ($a_1$=4.54 Å) and CdTe ($a_1$=4.58 Å) crystals.

Without wishing to be limited by theory, due to the hexagonal symmetry of the carbon atoms in graphitic layers, and the hexagonal symmetry of the atoms of cubic or hexagonal semiconductors in the [111] and [0001] crystal direction, respectively, (a preferred direction for most nanowire growth), a close lattice match between the graphitic substrate and semiconductor can be achieved when the semiconductor atoms are placed above the carbon atoms of the graphitic substrate, ideally in a hexagonal pattern. This is a new and surprising finding and can enable the epitaxial growth of nanowires on graphitic substrates.

The four different hexagonal arrangements of the semiconductor atoms as described above, can enable semiconductor nanowires of such materials to be vertically grown to form free standing nanowires on top of a thin carbon-based graphitic material.

Whilst it is ideal that there is no lattice mismatch between a growing nanowire and the substrate, nanowires can accommodate much more lattice mismatch than thin films for example. The nanowires of the invention may have a lattice mismatch of up to about 10% with the substrate and epitaxial growth is still possible. Ideally, lattice mismatches should be 7.5% or less, e.g. 5% or less.

For some semiconductors like cubic InAs (a=6.058 Å), cubic GaSb (a=6.093 Å), cubic CdSe (a=6.052 Å), and hexagonal CdSe ($a_1$=4.30 Å) the lattice mismatch is so small (<~1%) that excellent growth of these semiconductors can be expected.

For some semiconductors like GaAs (a=5.653 Å) the lattice mismatch is quite similar when the semiconductor atoms are placed on the same sites as in FIG. 1a (a=6.033 Å and thus the lattice constant for GaAs is 6.3% smaller), or alternating H- and B-sites as in FIG. 1b (a=5.255 Å and thus the lattice constant for GaAs is 8.2% larger), that both arrangements are possible. The process of the invention can enable semiconductor nanowires of the above mentioned materials to be vertically grown to form free standing nanowires on top of a thin carbon-based graphitic material as well as conventional substrates such as semi-conductors.

The nanowire grown in the present invention may be from 250 nm to several microns in length, e.g. up to 5 microns. Preferably the nanowires are at least 1 micron in length. Where a plurality of nanowires are grown, it is preferred if they all meet these dimension requirements. Ideally, at least 90% of the nanowires grown on a substrate will be at least 1 micron in length. Preferably substantially all the nanowires will be at least 1 micron in length.

Moreover, it will be preferred if the nanowires grown have the same dimensions, e.g. to within 10% of each other. Thus, at least 90% (preferably substantially all) of the nanowires on a substrate will preferably be of the same diameter and/or the same length (i.e. to within 10% of the diameter/length of each other). Essentially, therefore the skilled man is looking for homogeneity and nanowires than are substantially the same in terms of dimensions.

The length of the nanowires is often controlled by the length of time for which the growing process runs. A longer process typically leads to a (much) longer nanowire.

The nanowires have typically a hexagonal cross sectional shape. The nanowire may have a cross sectional diameter of 25 to 200 nm (i.e. its thickness). As noted above, the diameter is ideally constant throughout the majority of the nanowire. Nanowire diameter can be controlled by the manipulation of the ratio of the atoms used to make the nanowire as described further below.

Moreover, the length and diameter of the nanowires can be affected by the temperature at which they are formed. Higher temperatures encourage high aspect ratios (i.e. longer and/or thinner nanowires). The skilled man is able to manipulate the growing process to design nanowires of desired dimensions.

The nanowires of the invention are formed from at least one III-V compound, at least one II-VI compound or they can be nanowires grown from at least one group IV element selected from Si, Ge, Sn or Pb, especially Si and Ge. The formation therefore of pure group IV nanowires or nanowires such as SiC and SiGe is envisaged.

Group II elements are Be, Mg, Ca, Zn, Cd, and Hg. Preferred options here are Zn and Cd.

Group III options are B, Al, Ga, In, and Tl. Preferred options here are Ga, Al and In.

Group V options are N, P, As, Sb. All are preferred.

Group VI options include O, S, Se and Te. The use of Se and Te is preferred.

The manufacture of a group III-V compound is preferred. It will be appreciated that any compound which forms during nanowire growth need not be completely stoichiometric as the possibility of doping exists, as discussed below.

Preferred compounds for nanowire manufacture include AlAs, ZnO, GaSb, GaP, GaN, GaAs, InP, InN, InGaA, InAs, or AlGaAs or InAs, GaAs, InP, GaSb, InSb, GaP, ZnTe, SiC, CdSe and ZnSe, such as InAs, GaAs, InP, GaSb, InSb, GaP, ZnTe, CdSe and ZnSe. The use of GaAs or InAs is highly preferred. Other options include Si, ZnO, GaN, AlN and InN.

Whilst the use of binary materials is preferred, there is no reason why ternary or quaternary nanowires etc. cannot be grown by the method of the invention. Thus, ternary systems in which there are two group III cations with a group V anion are an option here, such as InGaAs and AlGaAs. The ternary compounds may therefore be of formula XYZ wherein X is a group III element, Y is a group III or V element different from X and Z, and Z is a group V element. The X to Y or Y to Z molar ratio in XYZ is preferably 0.1 to 0.9, i.e. the formula is preferably $X_xY_{1-x}Z$ (or $XY_{1-x}Z_x$) where subscript x is 0.1 to 0.9. Quaternary systems may be represented by the formula $A_xB_{1-x}C_yD_{1-y}$ where A and B are group III elements and C and D are group V elements. Again subscripts x and y are typically 0.1 to 0.9. Other options will be clear to the skilled man.

It is within the scope of the invention for the nanowires to be doped. Doping typically involves the introduction of impurity ions into the nanowire, e.g. during MBE growth. The doping level can be controlled from ~$10^{15}$/cm$^3$ to $10^{20}$/cm$^3$. The nanowires can be undoped (intrinsic), p-doped or n-doped as desired. Doped semiconductors are extrinsic conductors whereas undoped ones are intrinsic.

The n(p)-type semiconductors have a larger electron (hole) concentration than hole (electron) concentration by doping an intrinsic semiconductor with donor (acceptor) impurities. Suitable donor (acceptors) for III-V compounds can be Te (Be and Zn). Si can be amphoteric, either donor or acceptor depending on the site where Si goes to, depending on the orientation of the growing surface and the growth conditions. Dopants can be introduced during the growth process or by ion implantation of the nanowires after their formation.

The nanowires of the invention can be grown to have a heterostructured form radially or axially. For example for an axial heterostructured nanowire, p-n junction can be axially formed by growing a p-type doped core first, and then continue with an n-doped core. For an radially heterostructured nanowire, p-n junction can be radially formed by growing the p-doped nanowire core first, and then the n-doped semiconducting shell is grown.

The nanowires of the invention grow epitaxially. They attach to the underlying substrate through covalent, ionic or quasi van der Waals binding. Accordingly, at the junction of the substrate and the base of the nanowire, crystal planes are formed epitaxially within the nanowire. These build up, one upon another, in the same crystallographic direction thus allowing the epitaxial growth of the nanowire. Preferably the nanowires grow vertically. The term vertically here is used to imply that the nanowires grow perpendicular to the support. It will be appreciated that in experimental science the growth angle may not be exactly 90° but the term vertically implies that the nanowires are within about 10° of vertical/perpendicular, e.g. within 5°. Because of the epitaxial growth via covalent, ionic or quasi van der Waals bonding, it is expected that there will be an intimate contact between the nanowires and the substrate, especially graphitic substrate. To enhance the contact property further, the substrate, such as the graphitic substrate can be doped to match the major carriers of grown nanowires.

Because nanowires are epitaxially grown involving physical and chemical bonding to substrates at high temperature, the bottom contact is preferably ohmic.

It will be appreciated that the substrate comprises a plurality of nanowires. Preferably the nanowires grow about parallel to each other. It is preferred therefore if at least 90%, e.g. at least 95%, preferably substantially all nanowires grow in the same direction from the same plane of the substrate.

It will be appreciated that there are many planes within a substrate from which epitaxial growth could occur. It is preferred if substantially all nanowires grow from the same plane. It is preferred if that plane is parallel to the substrate surface. Ideally the grown nanowires are substantially parallel. Preferably, the nanowires grow substantially perpendicular to the substrate.

The nanowires of the invention should preferably grow in the [111] direction for nanowires with cubic crystal structure and [0001] direction for nanowires with hexagonal crystal structure. If the crystal structure of the growing nanowire is cubic, then the (111) interface between the nanowire and the catalyst droplet represents the plane from which axial growth takes place. If the nanowire has a hexagonal crystal structure, then the (0001) interface between the nanowire and the catalyst droplet represents the plane from which axial growth takes place. Planes (111) and (0001) both represent the same (hexagonal) plane of the nanowire, it is just that the nomenclature of the plane varies depending on the crystal structure of the growing nanowire.

The nanowires are preferably grown by molecular beam epitaxy (MBE). Whilst it is possible to use metal organic vapour phase epitaxy (MOVPE), the use of MBE is preferred. In this method, the substrate is provided with a molecular beam of each reactant, e.g. a group III element and a group V element preferably supplied simultaneously. A higher degree of control of the nucleation and growth of the nanowires on the graphitic substrate might be achieved with the MBE technique by using migration-enhanced epitaxy (MEE) or atomic-layer MBE (ALMBE) where e.g. the group III and V elements can be supplied alternatively.

A preferred technique is solid-source MBE, in which very pure elements such as gallium and arsenic are heated in separate effusion cells, until they begin to slowly evaporate (e.g. gallium) or sublimate (e.g. arsenic). The gaseous elements then condense on the substrate, where they may react with each other. In the example of gallium and arsenic, single-crystal GaAs is formed. The use of the term "beam" implies that evaporated atoms (e.g. gallium) or molecules (e.g. $As_4$ or $As_2$) do not interact with each other or vacuum chamber gases until they reach the substrate.

Doping ions can also be introduced easily using MBE. FIG. 2 is a possible set up of a MBE machine.

MBE takes place in ultra high vacuum, with a background pressure of typically around $10^{-10}$ to $10^{-9}$ Torr. Nanostructures are typically grown slowly, such as at a speed of up to a few, such as about 10, μm per hour. This allows nanowires to grow epitaxially and maximises structural performance. Catalyst The nanowires of the invention are grown in the presence of a catalyst. The catalyst can be one of the elements making up the nanowire—so called self catalysed, or different from any of the elements making up the nanowire.

For catalyst-assisted growth the catalyst may be Au or Ag or the catalyst may be a metal from the group used in the nanowire growth (e.g. group II or III metal), especially one of the metal elements making up the actual nanowire (self catalysis). It is thus possible to use another element from group III as a catalyst for growing a III-V nanowire e.g. use Ga as a catalyst for an In (group V) nanowire and so on. Preferably the catalyst is Au or the growth is self catalysed (i.e. Ga for a Ga (group V) nanowire and so on). The catalyst can be deposited onto the substrate to act as a nucleation site for the growth of the nanowires. Ideally, this can be achieved by providing a thin film of catalytic material formed over the substrate surface. When the catalyst film is melted (often forming a eutectic alloy with one or more of the semiconductor nanowire constituents) as the temperature increases to the growth temperature, it forms nanometer sized particle-like droplets on the substrate and these droplets form the points where nanowires can grow. This is called vapour-liquid-solid growth (VLS) as the catalyst is the liquid, the molecular beam is the vapour and the nanowire provides the solid component. In some cases the catalyst particle can also be solid during the nanowire growth, by a so called vapour-solid-solid growth (VSS) mechanism. As the nanowire grows (by the VLS method), the liquid (e.g. gold) droplet stays on the top of the nanowire. This is depicted in the figures. It remains at the top of the nanowire after growth and may therefore play a major role in contacting top graphitic layers as discussed herein.

As noted above, it is also possible to prepare self catalysed nanowires. By self catalysed is meant that one of the components of the nanowire acts as a catalyst for its growth.

For example, a Ga layer can be applied to the substrate, melted to form droplets acting as nucleation sites for the growth of Ga containing nanowires. Again, a Ga metal portion may end up positioned on the top of the nanowire. A similar process can be effected using group II or group III metals as catalysts for nanowires containing the catalyst as a component.

In more detail, a Ga/In flux can be supplied to the substrate surface for a period of time to initiate the formation of Ga/In droplets on the surface upon heating of the substrate. The substrate temperature can then be set to a temperature suitable for the growth of the nanowire in question. The growth temperature may be in the range 300 to 700° C. The temperature employed is, however, specific to the nature of the material in the nanowire, the catalyst material and the substrate material. For GaAs, a preferred temperature is 540 to 630° C., e.g. 590 to 630° C., such as 610° C. For InAs the range is lower, for example 420 to 540° C., such as 430 to 540° C., e.g. 450° C.

Nanowire growth can be initiated by opening the shutter of the Ga/In effusion cell and the counter ion effusion cell, simultaneously once a catalyst film has been deposited and melted.

The temperature of the effusion cells can be used to control growth rate. Convenient growth rates, as measured during conventional planar (layer by layer) growth, are 0.05 to 2 μm per hour, e.g. 0.1 μm per hour.

The pressure of the molecular beams can also be adjusted depending on the nature of the nanowire being grown. Suitable levels for beam equivalent pressures are between $1 \times 10^{-7}$ and $1 \times 10^{-5}$ Torr.

The beam flux ratio between reactants (e.g. group III atoms and group V molecules) can be varied, the preferred flux ratio being dependent on other growth parameters and on the nature of the nanowire being grown.

It has been found that the beam flux ratio between reactants can affect crystal structure of the nanowire. For example, using Au as a catalyst, growth of GaAs nanowires with a growth temperature of 540° C., a Ga flux equivalent to a planar (layer by layer) growth rate of 0.6 µm per hour, and a beam equivalent pressure (BEP) of $9\times10^{-6}$ Torr for $As_4$ produces wurtzite crystal structure. As opposed to this, growth of GaAs nanowires at the same growth temperature, but with a Ga flux equivalent to a planar growth rate of 0.9 µm per hour and a BEP of $4\times10^{-6}$ Torr for $As_4$, produces zinc blende crystal structure.

Nanowire diameter can in some cases be varied by changing the growth parameters. For example, when growing self-catalyzed GaAs nanowires under conditions where the axial nanowire growth rate is determined by the $As_4$ flux, the nanowire diameter can be increased/decreased by increasing/decreasing the $Ga:As_4$ flux ratio. The skilled man is therefore able to manipulate the nanowire in a number of ways.

It is thus an embodiment of the invention to employ a multistep, such as two step, growth procedure, e.g. to separately optimize the nanowire nucleation and nanowire growth.

A significant benefit of MBE is that the growing nanowire can be analysed in situ, for instance by using reflection high-energy electron diffraction (RHEED). RHEED is a technique typically used to characterize the surface of crystalline materials. This technology cannot be applied so readily where nanowires are formed by other techniques such as MOVPE.

One limitation of the techniques described above is that there is limited control over where nanowires grow on the surface of the substrate. Nanowires will grow where a catalyst droplet forms but there is little control over where those droplets might form. A further problem is that the size of the droplets cannot easily be controlled. If droplets form which are too small to initiate nucleation of a nanowire, yields of nanowires may be low. This is a particular problem when using gold catalysis as the droplets formed by the gold can be too small to allow high yielding nanowire growth.

In order to prepare a more regular array of nanowires with better homogeneity in height and diameter of grown nanowires, the inventors envisage the use of a mask on the substrate. This mask can be provided with regular holes, where nanowires can grow homogeneously in size in a regular array across the substrate. The hole patterns in the mask can be easily fabricated using conventional photo/e-beam lithography or nanoimprinting. Focussed ion beam technology may also be used in order to create a regular array of nucleation sites on the graphitic surface for the nanowire growth.

Thus a mask can be applied to the substrate and etched with holes exposing the substrate surface, optionally in a regular pattern. Moreover, the size of the holes can be carefully controlled. Catalyst can then be introduced into those holes to provide nucleating sites for nanowire growth. By arranging the holes regularly, a regular pattern of nanowires can be grown.

Moreover, the size of the holes can be controlled to ensure that only one nanowire can grow in each hole. Finally, the holes can be made of a size where the droplet of catalyst that forms within the hole is sufficiently large to allow nanowire growth. In this way, a regular array of nanowires can be grown, even using Au catalysis.

The mask material can be any materials which do not damage the underlying substrate when deposited. The holes used in this embodiment may be slightly bigger than the nanowire diameter, e.g. up to 200 nm. The minimum hole size might be 50 nm, preferably at least 100-200 nm. The thickness of the mask can be 50 to 300 nm.

The mask itself can be made of an inert compound, such as silicon dioxide or silicon nitride. In particular, the hole-patterned mask comprises at least one insulating material such as $SiO_2$, $Si_3N_4$, $HfO_2$, or $Al_2O_3$ e.g. deposited by e-beam evaporation, CVD, PE-CVD, sputtering, or ALD. The mask can therefore be provided on the substrate surface by any convenient technique such as by electron beam deposition, CVD, plasma enhanced-CVD, sputtering, and atomic layer deposition (ALD).

In order to prepare positioned Au catalysed nanowires on a substrate, a thin film of Au, such as with a thickness less than 50 nm, can be deposited after etching the hole patterns in the mask. The deposition can be made with a photo or e-beam resist remaining on top of the mask after each hole etch. By removing the photo or e-beam resist in a so called "lift-off" process, a regular arrayed pattern of Au dots on the substrate surface can be fabricated. Optionally the mask may be partially or completely removed after fabrication.

In particular, the simple use of vapour-solid growth may enable nanowire growth. Thus, in the context of MBE, simple application of the reactants, e.g. In and As, to the substrate without any catalyst can result in the formation of a nanowire. This forms a further aspect of the invention which therefore provides the direct growth of a semiconductor nanowire formed from the elements described above on a graphitic substrate. The term direct implies therefore the absence of a film of catalyst to enable growth.

As noted above, the nanowires of the invention preferably grow as cubic (zinc blende) or hexagonal (wurtzite) structures. The inventors have found that it is possible to change the crystal structure of the growing nanowire by manipulating the amounts of the reactants fed to the substrate as discussed above. Higher feeds of Ga, for example, force a GaAs crystal into the cubic crystal structure. Lower feeds encourage a hexagonal structure. By manipulating reactant concentrations, the crystal structure within the nanowire can therefore be changed.

The introduction of different crystal structures enables differing electronic properties to be present in the nanowire. This may enable the formation of crystal phase quantum dots and allow other interesting electronic technologies to be developed.

It is also within the scope of the invention for the nature of the material forming the nanowire to be changed during the growing process. Thus, by changing the nature of the molecular beams, a portion of different structure would be introduced into a nanowire. An initial GaAs nanowire could be extended with an InAs nanowire section for example by changing from a Ga feed to an In feed. The GaAs/InAs nanowire could then be extended with a GaAs nanowire section by changing back to a Ga feed and so on. Again, by developing different structures with differing electrical properties, the inventors offer nanowires with interesting and manipulable electronic properties which can be tailored by the manufacturer towards all manner of end applications.

Graphitic Top Contact

Once the nanowires have been grown on a substrate in the presence of a catalyst, it is envisaged that some of the nanowires will have a catalyst deposit on top of nanowire.

Ideally, the majority of the nanowires will have such a deposit, preferably substantially all the nanowires will comprise this deposit.

The invention then involves placing a graphitic layer on top of the formed nanowires to make a top contact. It is preferred that the graphitic top contact layer is substantially parallel with the substrate layer. It will also be appreciated that the area of the graphitic layer does not need to be the same as the area of the substrate. It may be that a number of graphitic layers are required to form a top contact with a substrate with an array of nanowires.

The graphitic layers used can be the same as those described in detail above in connection with the substrate. The top contact is graphitic, more especially it is graphene. This graphene substrate should contain no more than 10 layers of graphene or its derivatives, preferably no more than 5 layers (which is called as a few-layered graphene). Especially preferably, it is a one-atom-thick planar sheet of graphene.

The crystalline or "flake" form of graphite consists of many graphene sheets stacked together (i.e. more than 10 sheets). It is preferred if the top contact is 20 nm in thickness or less. Even more preferably, the graphitic top contact may be 5 nm or less in thickness.

When graphene contacts directly to the semiconductor materials which are the key components of opto-electric devices, it usually forms a Schottky contact which hinders the electrical current flow by creating a barrier at the contact junction. Due to this problem, the research on graphene deposited on semiconductors has been mainly confined to the use of graphene/semiconductor Schottky junctions, e.g. the Schottky junction solar cell, up to now.

However, the inventors have realized that the growing of semiconductor nanowires can involve metal catalysis. In the VLS method, e.g. MBE or MOVPE, the metal catalysts such as Au, Ga, or In are preferably used as seeds for nanowire growth and they remain as a form of nanoparticles on top of nanowires after completion of the nanowire growth. These catalyst deposits can be used as an intermediate material between metallic graphene and semiconductor nanowires. By taking advantage of the remaining catalytic material, the Schottky contact formed at the interface between metallic graphitic top contact and the semiconductor nanowire can be avoided and ohmic contact can be established.

Application of the top contact to the formed nanowires can be achieved by any convenient method. Methods akin to those mentioned previously for transferring graphitic layers to substrate carriers may be used. The graphitic layers from Kish graphite, highly ordered pyrolytic graphite (HOPG), or CVD may be exfoliated by mechanical or chemical methods. Then they can be transferred into etching solutions such as HF or acid solutions to remove Cu (Ni, Pt, etc.) (especially for CVD grown graphitic layers) and any contaminants from the exfoliation process. The etching solution can be further exchanged into other solutions such as deionised water to clean the graphitic layers. The graphitic layers can then be easily transferred onto the formed nanowires as the top contact. Again e-beam resist or photoresist may be used to support the thin graphitic layers during the exfoliation and transfer processes, which can be removed easily after deposition.

It is preferred if the graphitic layers are dried completely after etching and rinsing, before they are transferred to the top of the nanowire arrays. To enhance the contact between graphitic layers and nanowires a mild pressure and heat can be applied during this "dry" transfer.

Alternatively, the graphitic layers can be transferred on top of the nanowire arrays, together with a solution (e.g. deionised water). As the solution dries off, the graphitic layers naturally form a close contact to underlying nanowires. In this "wet" transfer method, the surface tension of the solution during the drying process might bend or knock out the nanowire arrays. To prevent this, where this wet method is used, more robust nanowires are preferably employed. Nanowires having a diameter of >80 nm might be suitable. Alternatively, hole patterned substrates which support the vertical nanowire structure could be used. One may also use the critical-point drying technique to avoid any damage caused by surface tension during the drying process.

If there is a water droplet on a nanowire array and attempts to remove it involve, for example a nitrogen blow, the water drop will become smaller by evaporation, but the drop will always try to keep a spherical form due to surface tension. This could damage or disrupt the nanostructures around or inside the water droplet.

Critical point drying circumvents this problem. By increasing temperature and pressure, the phase boundary between liquid and gas can be removed and the water can be removed easily.

The top contact graphitic layer is preferably transparent, conductive and flexible. To enhance the electrical and mechanical contact of the graphitic layers to the metal particles on top of as-grown nanowires further, a post-annealing process may be used. After the deposition of the graphitic top contact, the sample can be annealed in an inert atmosphere, e.g. of argon, or vacuum. Temperatures can be up to 600° C. Annealing times can be up to 10 min.

Also doping of the graphitic top contact can be utilized. The major carrier of the graphitic top contact can be controlled as either holes or electrons by doping. It is preferable to have the same doping type in the graphitic top contact and in the semiconducting nanowires, especially at the region below the metal catalytic particles, which would give a better ohmic behaviour after the post-annealing process. For example, for a core-shell nanowire with p-doping in the shell, p-doping of the top graphitic layers matches the carrier type across the metal particles at the top of the nanowire shell.

It will be appreciated therefore that both top graphitic layer and the substrate can be doped. In some embodiments, the substrate and/or the graphitic layer is doped by a chemical method which involves with an adsorption of organic or inorganic molecules such as metal chlorides ($FeCl_3$, $AuCl_3$ or $GaCl_3$), $NO_2$, $HNO_3$, aromatic molecules or chemical solutions such as ammonia.

The surface of substrate and/or the graphitic layer could also be doped by a substitutional doping method during its growth with incorporation of dopants such as B, N, S, or Si.

The nanowires of the invention may be coated by known methods, e.g. with radial epitaxial shells. For example, a mix of intrinsic and extrinsic semiconductors can be formed by coating an intrinsic or extrinsic core nanowire with a shell of the other type of semiconductor. A more complex nanowire can also be formed from a mix of extrinsic and intrinsic conductors. An insulating intrinsic layer can be placed between p and n doped extrinsic layers for instance. A p-doped core can therefore be covered by an intrinsic semiconductor shell with an n-doped extrinsic conductor shell on the outside (or vice versa). This has particular application in light-emitting diode and solar cell technology.

Shell coating can be effected by MBE or other epitaxial technique (e.g. MOVPE) using appropriate growth parameters that will be known/clear to the skilled man.

Applications

Semiconductor nanowires with a top-contact using graphitic layers of the invention may have wide ranging utility. They are semi-conductors so can be expected to offer applications in any field where semiconductor technology is useful. They are primarily of use in integrated nanoelectronics and nano-optoelectronic applications.

An ideal device for their deployment might be a solar cell in particular. One possible device is a nanowire solar cell sandwiched between two graphene layers as the two terminals.

Such a solar cell has the potential to be efficient, cheap and flexible at the same time. This is a rapidly developing field and further applications on these valuable materials will be found in the next years. The same concept can be used to also fabricate other opto-electronic devices such as light-emitting diodes (LEDs), waveguides and lasers.

The invention will now be further discussed in relation to the following non limiting examples and figures.

BRIEF DESCRIPTION OF THE FIGURES

FIG. 6b shows a SEM image of GaAs nanowire arrays covered with a graphene layer deposited on top. The nanowire arrays were grown as in FIG. 6a.

FIG. 6c shows a magnified SEM image of GaAs nanowire arrays covered with a graphene layer partially deposited on top. The nanowire arrays were grown as in FIG. 6a.

EXAMPLE 1

Figure 1:
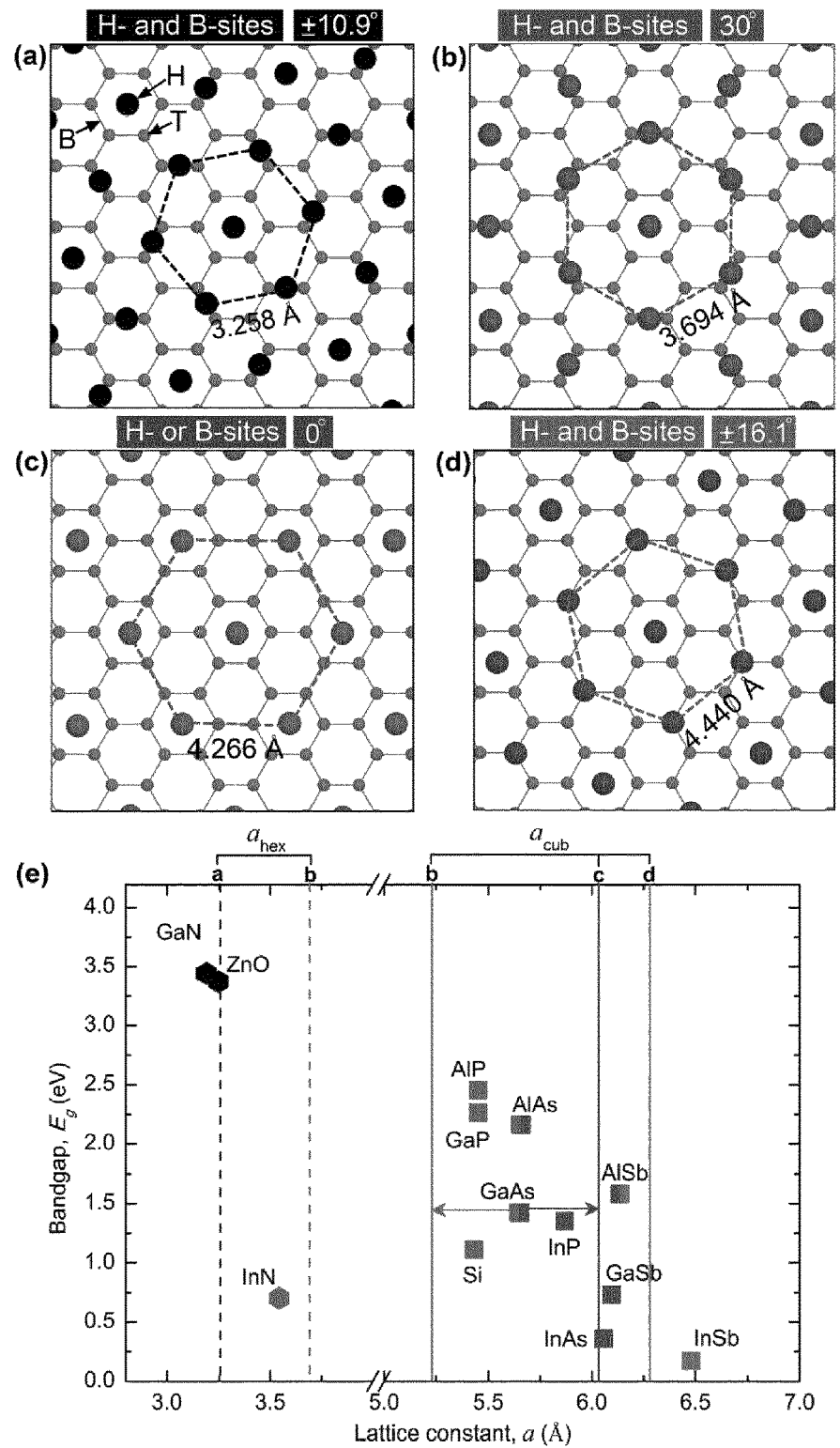
FIG. 1a-d shows the atomic arrangements when atoms are placed on 1) H- and B-sites (FIGS. 1a, b, and d), and 2) H- or B-sites (FIG. 1c).
In FIG. 1e the bandgap energies of the III-V semiconductors (as well as Si and ZnO) are plotted against their lattice constants. Vertical solid (dashed) coloured lines depict the lattice constant of an ideal crystal that would give perfect lattice match with graphene for a cubic (hexagonal) crystal with the four different atomic arrangements (FIG. 1a-d) with respect to graphene. The plot visualizes the vast possibilities for epitaxial growth of vertical semiconductor nanowires on graphitic substrates. In the case of some semiconductors, the lattice mismatch with graphene is very small (e.g. InAs, GaSb, and ZnO) for one suggested atomic configuration. For other semiconductors like GaAs, the lattice mismatch is quite large and in-between two different atomic configurations (as in FIG. 1b or FIG. 1c).
Figure 2:
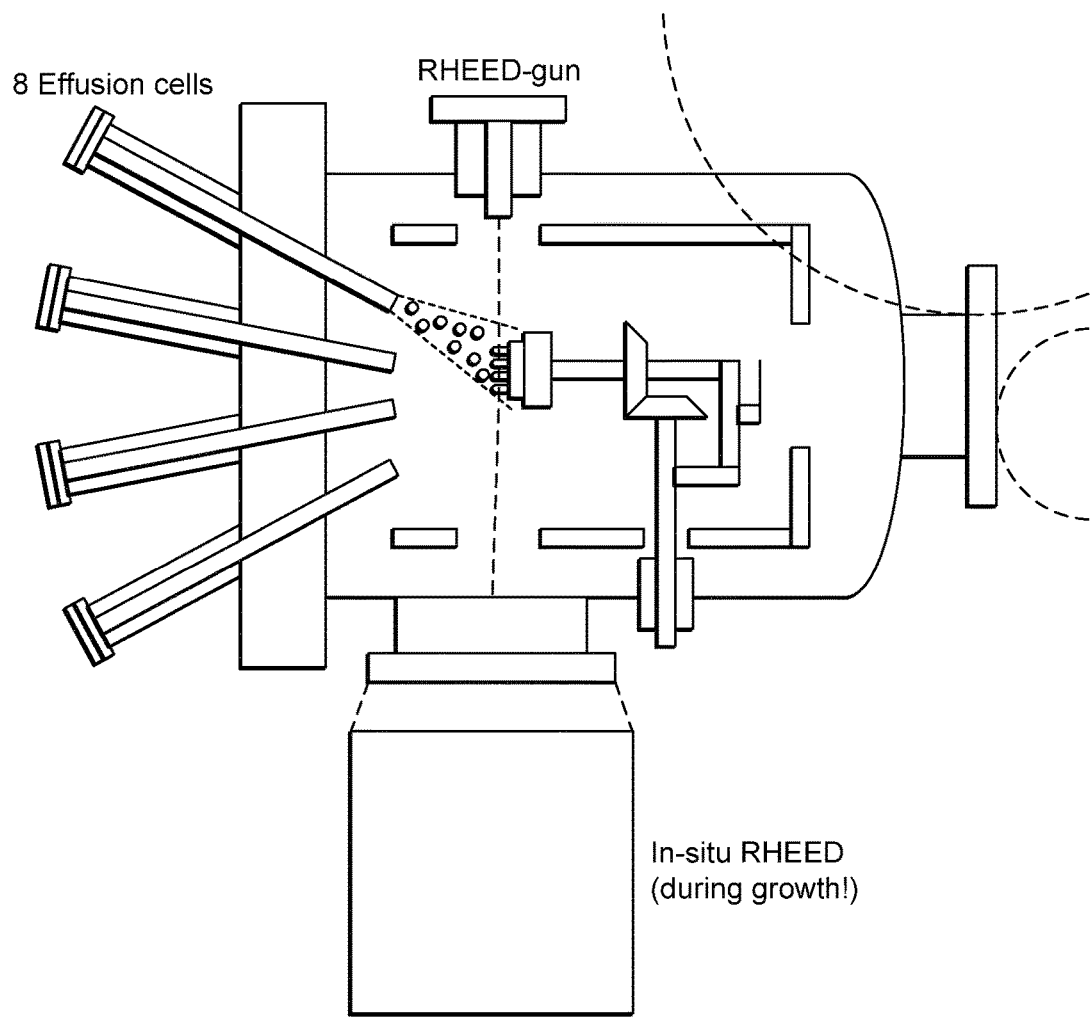
FIG. 2 shows a MBE experimental set up.
Figure 3A:
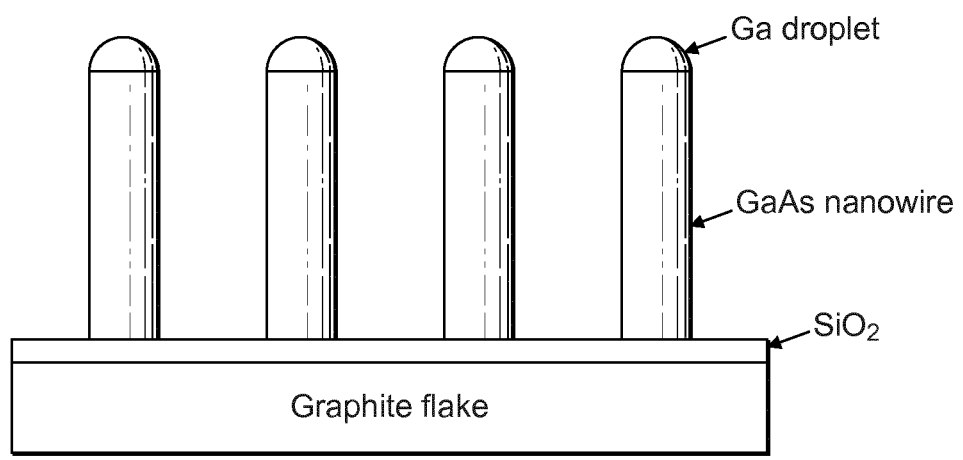
FIG. 3a is an idealised depiction of Ga (self) catalysed GaAs nanowires grown on graphite.
Figure 3B:
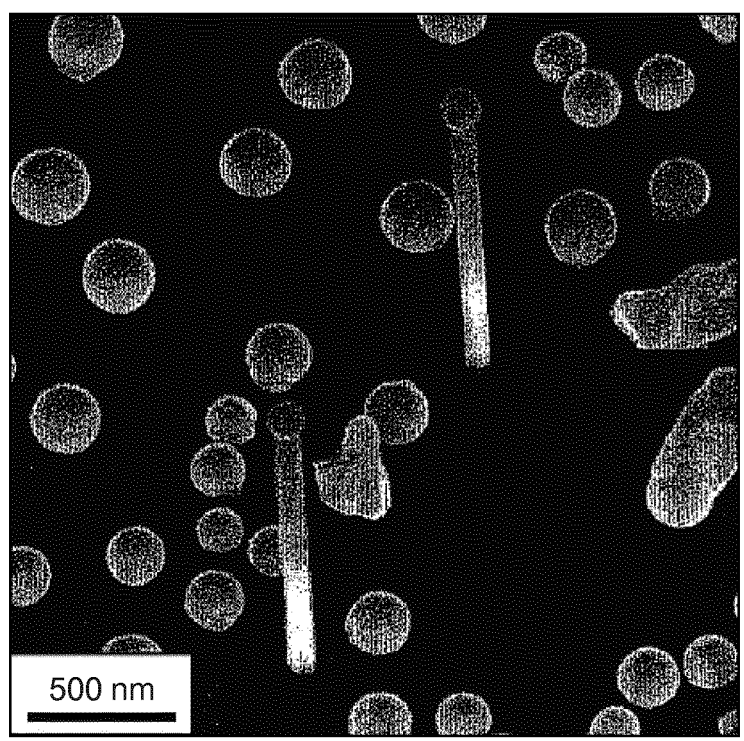
FIG. 3b is a 45° tilted view SEM image of two vertical Ga assisted GaAs nanowires grown by MBE on a flake of Kish graphite. The spherical particles are Ga droplets.
Figure 3C:
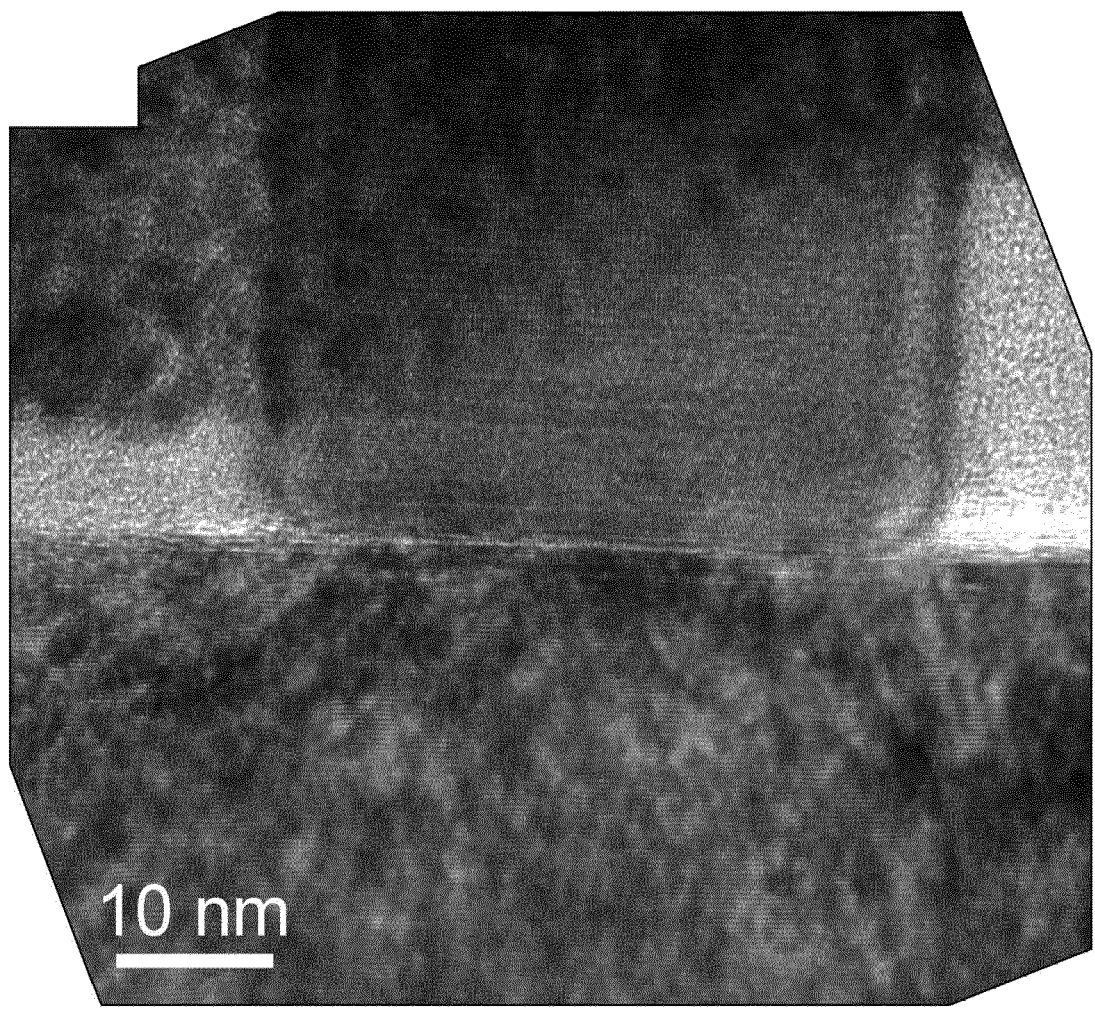
FIG. 3c is a cross sectional TEM image of the graphite/nanowire interface of a vertical Ga-assisted GaAs nanowire grown epitaxially on top of Kish graphite.
Figure 4:
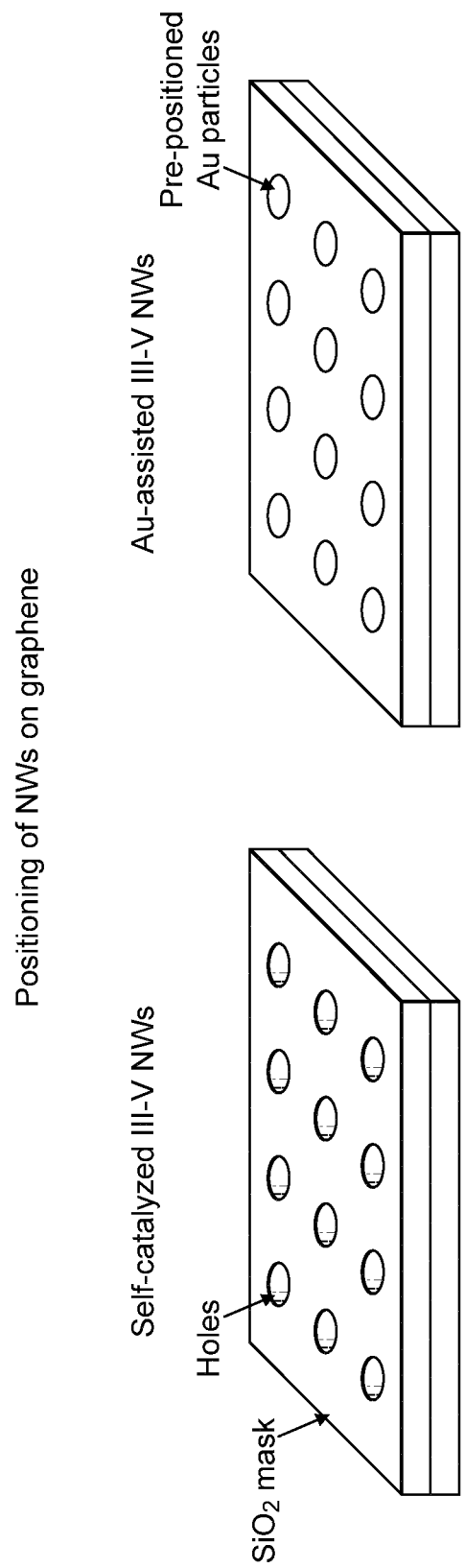
FIG. 4 shows a depiction of a mask on the graphite surface, which has been etched with holes.
Figure 5A:
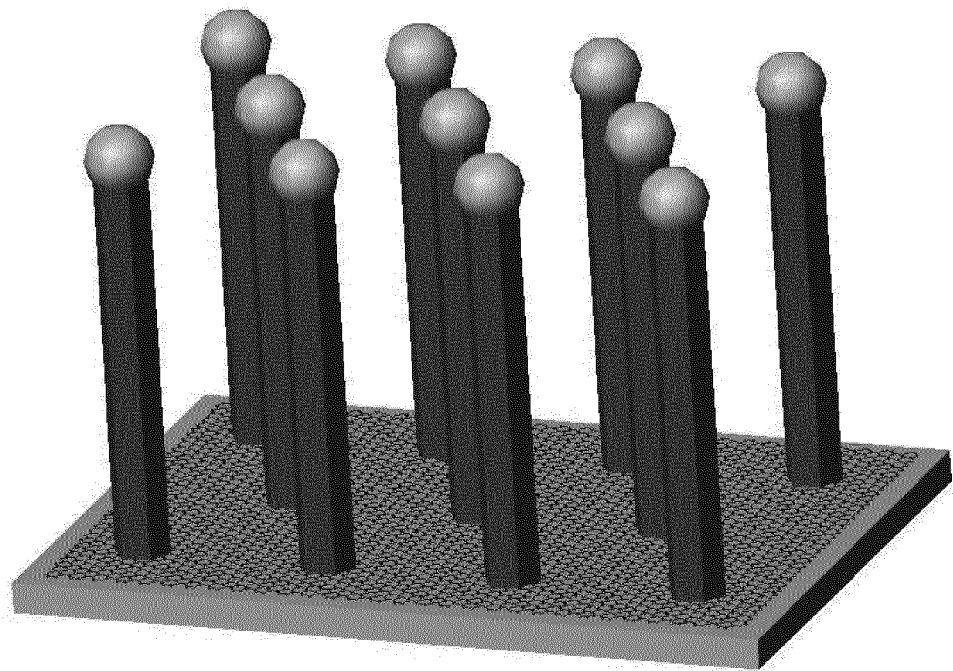
FIG. 5a shows a schematic image of semiconducting nanowires grown by a metal catalyst-assisted vapour-liquid-solid (VLS) method. The substrate is graphene deposited on a $SiO_2$ substrate.
Figure 5B:
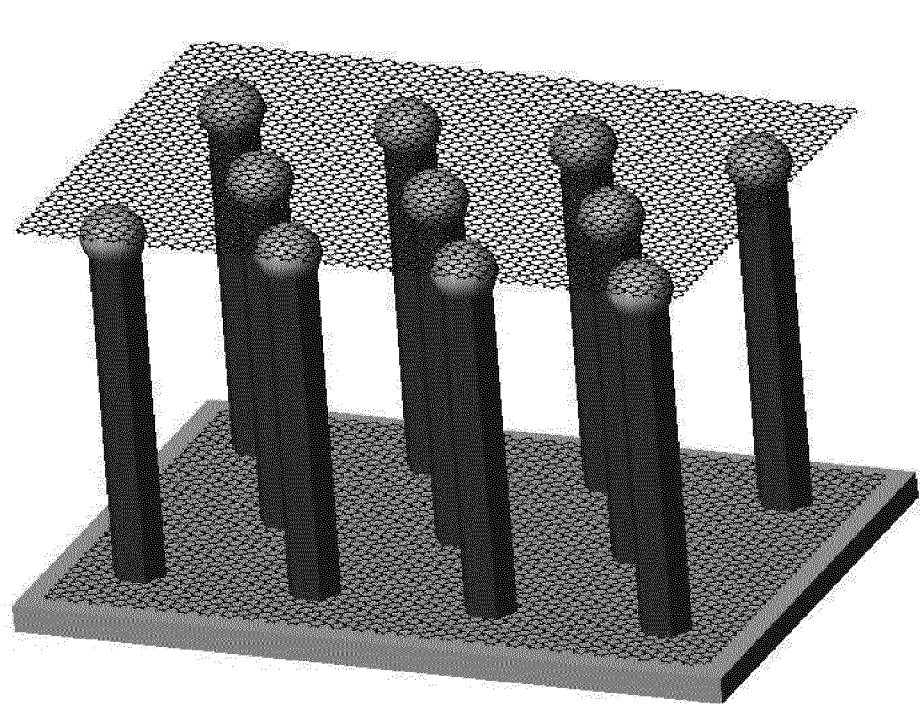
FIG. 5b shows a schematic image as in FIG. 5a but here with graphene as a top contact material. It can be also envisaged as a nanowire solar cell with the two graphene layers as the two terminals.
Figure 6A:
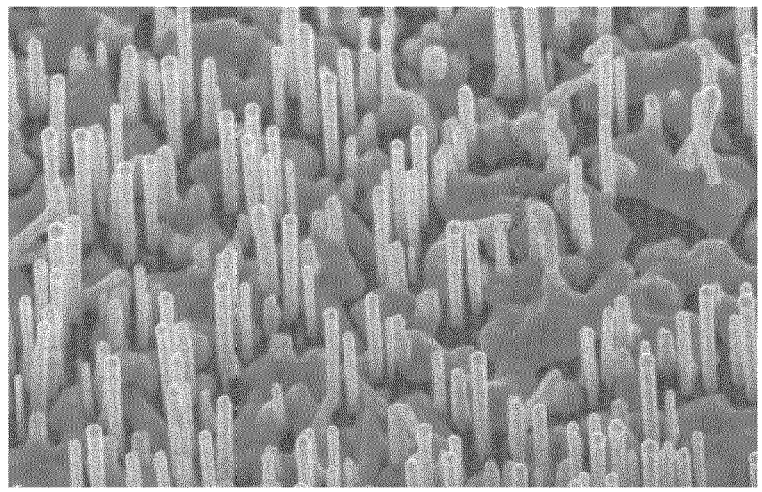
FIG. 6a shows a tilted view SEM image of Ga-assisted GaAs nanowire arrays grown on a Si(111) substrate by MBE.
Figure 6B:
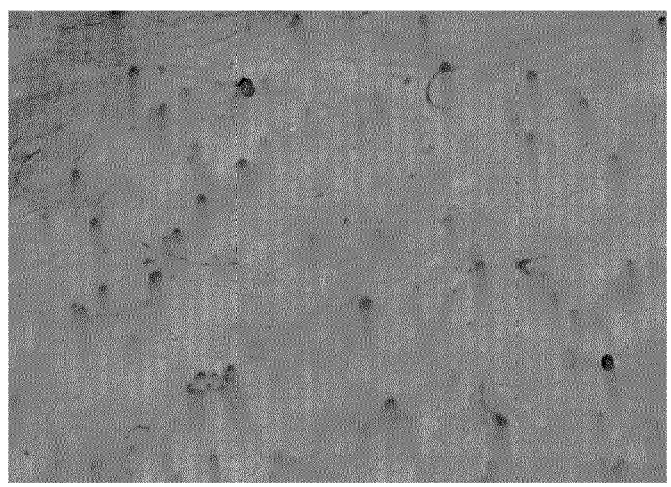
Figure 6C:

Experimental Procedure for Growing Vertical Nanowires on Graphitic Substrates

Nanowires were grown in a Varian Gen II Modular molecular beam epitaxy (MBE) system equipped with a Ga dual filament cell, an In SUMO dual filament cell, and an As valved cracker cell, allowing to fix the proportion of dimers and tetramers. In the present study, the major species of arsenic were $As_4$. Growth of NWs is performed either on a Kish graphite flake or on a graphene film (1 to 7 monolayers thick) grown by a chemical vapor deposition (CVD) technique directly on a Ni or Pt film deposited on an oxidized silicon wafer. The samples were prepared using two different procedures. In the first procedure, the samples were cleaned by iso-propanol followed by a blow dry with nitrogen, and then In-bonded to the silicon wafer. In the second procedure, a ~30 nm thick $SiO_2$ layer was deposited in an electron-beam evaporator chamber on the samples prepared using the first procedure where after holes of ~100 nm in diameter were fabricated in the $SiO_2$ using electron-beam lithography and plasma etching.

The samples were then loaded into the MBE system for the nanowire growth. The substrate temperature was then increased to a temperature suitable for GaAs/InAs nanowire growth: i.e. 610° C./450° C., respectively. The Ga/In flux was first supplied to the surface during a time interval typically in the range 5 s to 10 minutes, dependent on Ga/In flux and desired droplet size, while the As shutter was closed, to initiate the formation of Ga/In droplets on the surface. GaAs/InAs nanowire growth was initiated by simultaneously opening the shutter of the Ga/In effusion cell and the shutter and valve of the As effusion cell. The temperature of the Ga/In effusion cell was preset to yield a nominal planar growth rate of 0.1 µm per hour. To form the GaAs nanowires, an $As_4$ flux of $1.1 \times 10^{-6}$ Torr is used, whereas the $As_4$ flux is set to $4 \times 10^{-6}$ Torr to form InAs nanowires.

EXAMPLE 2

Experimental Procedure for Growing Vertical GaAs Nanowires on GaAs (111)B or Si(111) Substrates For growing Au-catalyzed GaAs nanowires on GaAs (111)B substrates, the substrate surface was first deoxidized at 620° C. and then a 60 nm thick GaAs film was grown under growth conditions producing an atomically flat surface in the MBE system. It was transferred to an electron-beam evaporator for thin Au film deposition. The sample was then loaded into the MBE system again for nanowire growth. $As_4$ was used as the major species for As source. Under an $As_4$ flux of $6 \times 10^{-6}$ Torr, the substrate temperature was increased to 540° C. for GaAs nanowire growth. At this stage, thin Au film turned into Au particles and alloyed with the Ga from the substrate forming Au—Ga liquid particles. GaAs nanowire growth was initiated by opening the shutter of the Ga effusion cell. The temperature of the Ga effusion cell was preset to yield a nominal planar GaAs growth rate of 0.7 $MLs^{-1}$. Growth of GaAs nanowires was always terminated by shutting down the Ga and As fluxes, and immediately ramping down the substrate to room temperature.

For the growth of Ga self-catalyzed GaAs nanowires on Si(111) substrates, the Si substrates were etched in HF (5%) for 10 sec to remove the native oxide, rinsed in deionized water for 1 min, dried by blowing $N_2$ gas, and then directly loaded inside the MBE chamber. The major As specie used was $As_4$. The substrates were ramped up to the growth temperature of 620° C. The GaAs nanowire growth started by opening the Ga and As shutters simultaneously. The GaAs nanowire growth was initiated by simultaneously opening the shutter of the Ga effusion cell and the shutter and valve of the As effusion cell.

EXAMPLE 3

Experimental Procedure for Transferring the Graphitic Layers on Top of Nanowire Arrays Graphitic layers (<5 layers) grown on Cu foils were used. Since graphitic layers are formed on both sides of Cu foil during CVD growth, the graphitic layers formed on one side were removed by oxygen plasma to expose the Cu for etching. This was then dipped in a dilute iron nitrate $(Fe(NO_3)_3)$ solution (<5%) to etch Cu away completely. After etching overnight (>8 hrs), the graphitic layers were floated on the etching solution, which were exchanged into deionised water. After further rinsing with deionised water several times, the graphitic layers were transferred on the nanowire arrays with deionised water. Deionised water was dried naturally in a clean room without any $N_2$ blow.

The invention claimed is:

1. A device, comprising:
 a plurality of epitaxial nanowires on a substrate, the plurality of epitaxial nanowires having been grown epitaxially on the substrate in the presence of a metal catalyst such that a catalyst deposit is located at the top of at least some of the plurality of epitaxial nanowires,
 wherein the plurality of epitaxial nanowires comprise at least one Group III-V compound;
 wherein the substrate comprises graphene, graphane, or graphene oxide;
 wherein the substrate has a thickness of 20 nm or less;
 wherein the plurality of epitaxial nanowires have been grown in the [111] or [0001] direction; and
 wherein a graphitic layer is in contact with at least some of the catalyst deposits on top of at least some of the plurality of epitaxial nanowires.

2. The device of claim 1, wherein the plurality of epitaxial nanowires comprise AlAs, AlN, GaSb, GaP, GaN, GaAs, InP, InN, InGaAs, InGaN, InAs, AlGaAs, AlGaN, or AlInGaN.

3. The device of claim 1, wherein the graphene, graphane, or graphene oxide comprises 10 or fewer atomic layers.

4. The device of claim 1, wherein the substrate and/or the graphitic layer is a laminated substrate exfoliated from a Kish graphite, a highly ordered pyrolytic graphite, or CVD-grown graphene layers on metallic films or foils.

5. The device of claim 1, wherein the substrate and/or the graphitic layer is a CVD-grown graphene layer on a Cu or Pt film.

6. The device of claim 1, wherein the substrate and/or the graphitic layer is flexible and transparent.

7. The device of claim 1, wherein the substrate's surface and/or the graphitic layer is modified with a plasma treatment with a gas of oxygen, hydrogen, NO, or their combinations.

8. The device of claim 1, wherein the substrate's surface and/or the graphitic layer is modified by doping using a solution of $FeCl_3$, $AuCl_3$, or $GaCl_3$.

9. The device of claim 1, wherein the substrate's surface and/or the graphitic layer is doped by adsorption of organic or inorganic molecules.

10. The device of claim 9, wherein the substrate's surface and/or the graphitic layer is doped by adsorption of metal-chlorides, $NO_2$, $HNO_3$, aromatic molecules, or ammonia.

11. The device of claim 9, wherein the substrate's surface and/or the graphitic layer is doped by a substitutional doping method during its growth with incorporation of a dopant, wherein the dopant is B, N, S, or Si.

12. The device of claim 1, wherein the plurality of epitaxial nanowires are no more than 500 nm in diameter and have a length of up to 5 µm.

13. The device of claim 1, wherein the plurality of epitaxial nanowires are substantially parallel to each other.

14. The device of claim 1, wherein the catalyst is Au or Ag.

15. The device of claim 1, wherein the graphitic layer is graphene.

16. The device of claim 1, wherein the graphitic layer is doped with doping ions and the plurality of epitaxial nanowires are doped with the same doping ions.

17. A process for the preparation of the device of claim 1, comprising:
 (I) providing Group III-V elements to a surface of the substrate using a molecular beam;
 (II) epitaxially growing the plurality of epitaxial nanowires from the surface of the substrate in the presence of the metal catalyst such that the catalyst deposit remains on top of at least some of the plurality of epitaxial nanowires; and
 (III) contacting the metal catalyst deposits with the graphitic layer such that the graphitic layer is in contact with at least some of the catalyst deposits on top of at least some of the plurality of epitaxial nanowires.

18. The process of claim 17, wherein the substrate is coated with a hole-patterned mask.

19. The process of claim 18, wherein the catalyst is introduced on to the substrate surface exposed via the hole pattern.

20. The process of claim 18, wherein the hole-patterned mask comprises at least one insulating material chosen from $SiO_2$, $Si_3N_4$, $HfO_2$, or ANO deposited by e-beam evaporation, CVD, PE-CVD, sputtering, or ALD.

21. The process of claim 18, wherein the surface of the substrate exposed through the hole pattern is modified with a plasma treatment with a gas of oxygen, hydrogen, $NO_2$, or their combinations.

22. The process of claim 17, wherein the graphitic layer is subjected to a post-annealing process.

* * * * *